(12) United States Patent
Nakanishi (10) Patent No.: US 7,259,736 B2
(45) Date of Patent: Aug. 21, 2007

(54) ELECTRO-OPTICAL DEVICE, ACTIVE-MATRIX SUBSTRATE, AND ELECTRONIC APPARATUS

(75) Inventor: Hayato Nakanishi, Toyama (JP)

(73) Assignee: Seiko Epson Corporation, Tokyo (JP)

( * ) Notice: Subject to any disclaimer, the term of this patent is extended or adjusted under 35 U.S.C. 154(b) by 440 days.

(21) Appl. No.: 10/712,381

(22) Filed: Nov. 14, 2003

(65) Prior Publication Data

US 2004/0130512 A1 Jul. 8, 2004

(30) Foreign Application Priority Data

Nov. 29, 2002 (JP) .............................. 2002-348622

(51) Int. Cl.
*G09G 5/00* (2006.01)
(52) U.S. Cl. .................... 345/82; 345/76; 345/103; 345/84; 349/73; 315/169.3
(58) Field of Classification Search ............. 345/76–83, 345/204–205, 87–103; 257/552; 340/815.45; 313/498; 315/169.3, 169.4
See application file for complete search history.

(56) References Cited

U.S. PATENT DOCUMENTS

| | | | | |
|---|---|---|---|---|
| 4,773,737 A | * | 9/1988 | Yokono et al. ............. | 349/109 |
| 5,831,699 A | * | 11/1998 | Wright et al. ............... | 349/73 |
| 6,522,315 B2 | | 2/2003 | Ozawa et al. | |
| 6,661,397 B2 | * | 12/2003 | Mikami et al. .............. | 345/76 |
| 6,788,277 B2 | * | 9/2004 | Kanauchi et al. ........... | 345/77 |
| 6,950,081 B2 | * | 9/2005 | Akimoto et al. ............ | 345/55 |
| 6,954,191 B1 | | 10/2005 | Hirano et al. | |
| 7,012,588 B2 | * | 3/2006 | Siwinski ..................... | 345/83 |
| 2002/0118150 A1 | | 8/2002 | Kwon | |
| 2003/0067458 A1 | * | 4/2003 | Anzai .......................... | 345/204 |
| 2004/0036421 A1 | * | 2/2004 | Arnold et al. ............ | 315/169.3 |

FOREIGN PATENT DOCUMENTS

| | | |
|---|---|---|
| CN | 1343346 A | 4/2002 |
| CN | 1361510 A | 7/2002 |
| WO | WO98/36407 | 8/1998 |

* cited by examiner

*Primary Examiner*—Lun-Yi Lao
(74) *Attorney, Agent, or Firm*—Oliff & Berridge, PLC (57) ABSTRACT

To provide an electro-optical device and an electronic apparatus which reduce directional viewing variation that occurs between the column and row directions and to provide an active matrix substrate suitable for the electro-optical device. In each pixel circuit arranged at a display panel portion in a matrix, the upper left side of the formation region is allotted to a green pixel-forming region having an organic EL element that emits green, the upper right side is allotted to a blue pixel-forming region having an organic EL element that emits blue, the lower left side is allotted to a dummy forming region having no light-emitting organic EL element, and the lower right side is allotted to a red pixel-forming region having an organic EL element that emits red. Two adjacent same-color organic EL elements are formed at regular intervals with one forming region interposed therebetween.

37 Claims, 8 Drawing Sheets

ELECTRO-OPTICAL DEVICE, ACTIVE-MATRIX SUBSTRATE, AND ELECTRONIC APPARATUS

BACKGROUND OF THE INVENTION

1. Field of Invention

The present invention relates to an electro-optical device, an active matrix substrate, and an electronic apparatus.

2. Description of Related Art

One type of driving system for a related art display having liquid-crystal elements, organic EL (electroluminescent) elements, electrophoresis elements, electron emitting elements, or the like is an active matrix drive system. An active-matrix drive system display includes a display panel that has a plurality of pixels in a matrix. The pixels have respective pixel circuits, each of which is constituted by electro-optical elements and driving transistors for supplying drive power to the electro-optical elements. The pixel circuits are arranged so as to correspond to respective intersections of data lines and scan lines (see Pamphlet of International Publication No. WO98/36407).

When the pixel circuits have different shapes and/or different pitches in the column direction (data-line direction) and the row direction (scan-line direction) of the display panel portion, directional viewing variation occurs between the column direction and the row direction of the display panel. As a result, an image displayed on the display panel portion may be distorted in the column direction (data-line direction) or the row direction (scan-line direction). In particular, for a full-color display, color irregularities occur in addition to the distortion of the image in the column and row directions. Thus, the display quality of the display is reduced.

SUMMARY OF THE INVENTION

The present invention provides an electro-optical device and an electro-optical apparatus which reduce directional viewing variation between the column and row directions. The present invention provides an active matrix substrate suitable for the electro-optical device.

An electro-optical device according to an aspect of the present invention includes a plurality of effective optical regions that are provided above a substrate and that have electro-optical elements and a wiring region that is provided on the substrate and that has wires to supply power or electric signals to the electro-optical elements. At least three of the effective optical regions are in contact with ineffective-optical regions directly or via part of the wiring region, the electro-optical elements not being provided in the ineffective-optical regions.

According to an aspect of the present invention, the effective optical regions having the electro-optical elements are arranged so as to sandwich the ineffective optical regions that have no electro-optical elements. Thus, it is possible to uniformly arrange the electro-optical elements in the column and row directions of a display. As a result, directional viewing variation that occurs between the column direction and the row direction of the display panel portion can be reduced, thereby making it possible to reduce distortion of an image.

In this electro-optical device, the plurality of effective optical regions may include a plurality of first effective optical regions in which first electro-optical elements are provided and a plurality of second effective optical regions in which second electro-optical elements are provided, and the ineffective optical region may be arranged so as to be sandwiched by two of the first effective optical regions and so as to be sandwiched by two of the second effective optical regions.

With this arrangement, allotting the electro-optical elements to electro-light emitting elements that emit green and blue allows the electro-optical device to display a full-color image. In such a case, it is possible to reduce color irregularities in the column and row directions of the display panel portion of the electro-optical device. As a result, for a full-color display, the generation of color irregularities can be suppressed in the column and row directions in addition to the suppression of image distortion. Thus, the display quality of the display can be enhanced.

An electro-optical device according to an aspect of the present invention includes a plurality of first effective optical regions that are provided above a substrate and that have first electro-optical elements, a plurality of second effective optical regions that are provided above the substrate and that have second electro-optical elements, and a plurality of ineffective optical regions that are provided above the substrate and that have no electro-optical elements. Each of the ineffective optical regions is arranged so as to be sandwiched by two of the first effective optical regions and so as to be sandwiched by two of the second effective optical regions.

According to an aspect of the present invention, the first electro-optical elements or the second electro-optical elements can be arranged so as to sandwich the ineffective optical regions having no electro-optical elements.

In this electro-optical device, the first effective optical regions or the second effective optical regions may not be arranged so as to be adjacent to each other.

With this arrangement, the first electro-optical elements and the second electrical elements can be arranged in regular directions and at regular intervals in the column and row directions of the display. As a result, directional viewing variation that occurs between the column direction and the row direction of the display panel portion can be reduced, thereby making it possible to reduce distortion of an image.

In this electro-optical device, the first effective optical regions and the second effective optical regions may have the same shape.

With this arrangement, the first and second electro-optical elements can be formed on the same condition, thereby making it possible to reduce coating spots during the formation of the first and second electro-optical elements.

In this electro-optical device, the ineffective optical regions may have anti-reflection members.

With this arrangement, since the anti-reflection member is provided in the ineffective optical region included in one pixel, black can be reliably displayed at one pixel and a contrast ratio can be increased.

In this electro-optical device, the first and second effective optical regions may have respective electronic circuits to drive the electro-optical elements provided in the first and second effective optical regions.

With this arrangement, the first and second electro-optical elements provided in the first and second effective optical regions are driven by the electronic circuits provided in the same effective optical regions.

In this electro-optical device, at least one of the first and second effective optical regions may have an electronic circuit to drive the electrical optical element provided in another first or second effective optical region.

With this arrangement, the electronic circuit to drive the first or second electro-optical element provided in the first or second effective optical region can be provided in the first or second effective optical region. As a result, the aperture ratio of pixels can be increased.

In this electro-optical device, the ineffective optical region may have an electronic circuit to drive the electro-optical elements provided in at least one of the first effective optical regions and at least one of the second effective optical regions.

With this arrangement, the individual electronic circuits to drive the first and second electro-optical elements provided in the first and second effective regions can be formed in the ineffective optical regions. As a result, the aperture ratio of pixels can be increased.

In this electro-optical device, at least one of the effective optical regions may be in contact with an ineffective optical region in which no electronic circuit is provided below an electrode provided in the effective optical region or the electrode is not provided above the electronic circuit.

With this arrangement, the ineffective optical regions and the effective optical regions can be planarized, thereby making it possible to eliminate pixel irregularities. Also, the aperture ratio in the effective optical regions can be increased, thereby making it possible to provide a display having yet lower power consumption.

This electro-optical device may further include pixels that are provided so as to correspond to respective intersections of a plurality of scan lines and a plurality of data lines. The electronic circuits may drive the electro-optical elements in accordance with scan signals from the scan lines and data signals from the data lines.

With this arrangement, it is possible to increase the display quality of the electro-optical device that drives the electro-optical elements in accordance with the scan signals from the scan lines and the data signals from the data lines.

In this electro-optical device, the electronic circuits may include first transistors to supply data signals during electrical conduction; capacitance elements to store, as an amount of charge, the data signals supplied from the first transistors; and second transistors to supply an amount of current corresponding to the electrical-conduction state to the electro-optical elements. The electrical-conduction state is controlled in accordance with the amount of charge stored by the capacitance elements.

With this arrangement, when the first transistors to supply the data signals are put into the electrical conduction states, the data signals to be supplied via the first transistors are supplied to the corresponding capacitance elements. The electrical conduction states of the second transistors are controlled based on an amount of charge in accordance with data signals stored by the capacitance elements. The second transistors supply an amount of current corresponding to the electrical conduction states to the electro-optical elements.

In this electro-optical device, the first electro-optical element and the second electro-optical element may be constituted by two electro-optical elements selected from an electro-optical element that emits green, an electro-optical element that emits blue, and an electro-optical element that emits red.

With this arrangement, it is possible to display a color image that is reduced in color irregularities in the column and row directions of the display panel portion.

In this electro-optical device, each of the first electro-optical elements and the second electro-optical elements may be an EL element.

With this arrangement, each EL element emits light so as to correspond to the conduction state of the corresponding second transistor.

In this display panel, the EL element may have a light-emitting layer that is made of organic material.

In this case, the light-emitting layer of the EL element is constituted by an organic EL element that is made of organic material.

An electro-optical device according to an aspect of the present invention includes a plurality of first light-emitting regions that are provided above a substrate and that have first light-emitting films, a plurality of second light-emitting regions that are provided above the substrate and that have second light-emitting films, and a plurality of non-luminous regions that are provided above the substrate and that have no light-emitting films. Each of the non-luminous regions is arranged so as to be sandwiched by two of the first light-emitting regions and so as to be sandwiched by two of the second light-emitting regions.

According to an aspect of the present invention, the first light-emitting films or the second light-emitting films can be arranged so as to sandwich the non-luminous regions having no light-emitting films.

In this electro-optical device, the first light-emitting films or the second light-emitting films are not arranged so as to be adjacent to each other.

With this arrangement, the first and second light-emitting films can be arranged in regular directions and at regular intervals in the column and row directions of the display. As a result, directional viewing variation that occurs between the column direction and the row direction of the display panel portion can be reduced, thereby making it possible to reduce distortion of an image.

In this electro-optical device, the first light-emitting regions and the second light-emitting regions may have the same shape.

With this arrangement, the first and second light-emitting films can be formed on the same condition, thereby making it possible to reduce coating spots during the formation of the first and second light-emitting films.

In this electro-optical device, the non-luminous regions may have anti-reflection members.

With this arrangement, since the anti-reflection member is provided in the non-luminous region included in one pixel, black can be reliably displayed at one pixel and a contrast ratio can be increased.

In the electro-optical device, the first and second light-emitting regions may have respective electronic circuits to control light emission of the corresponding first and second light-emitting films.

With this arrangement, the first and second electro-optical elements provided in the first and second effective optical regions are driven by the electronic circuits provided in the same effective optical regions.

In this electro-optical device, at least one of the first and second light-emitting regions may have an electronic circuit to control light emission of the first or second light-emitting film provided in another first or second light-emitting region.

With this arrangement, the electronic circuit to drive the first or second light-emitting film provided in the first or second light-emitting region can be formed in the first or second light-emitting region. As a result, the aperture ratio of pixels can be increased.

In this electro-optical device, the non-luminous region may have an electronic circuit to control light emission of the first or second light-emitting film provided in at least one of the first or second light-emitting regions.

With this arrangement, the individual electronic circuits to drive the first and second light-emitting films provided in the first and second light-emitting regions can be formed in the non-luminous regions. As a result, the aperture ratio of pixels can be increased.

This electro-optical device may further include pixels that are provided so as to correspond to respective intersections of a plurality of scan lines and a plurality of data lines. The electronic circuits for the corresponding pixels may control light emission of the first or second light-emitting films in accordance with scan signals from the scan lines and data signals from the data lines.

With this arrangement, it is possible to increase the display quality of the electro-optical device that drive the first or second light-emitting films in accordance with the scan signals from the scan lines and the data signals from the data lines.

In this electro-optical device, the first light-emitting film and the second light-emitting film may be constituted by two light-emitting films selected from a light-emitting film that emits green, a light-emitting film that emits blue, and a light-emitting film that emits red.

With this arrangement, it is possible to display a color image that is reduced in color irregularities in the column and row directions of the display panel portion.

In this electro-optical device, each of the first and second light-emitting films may be made of organic material.

In this case, the EL element is constituted by an organic EL element the light-emitting layer of which is made of organic material.

An active matrix substrate according to an aspect of the present invention includes a plurality of element forming regions that are provided above a substrate and that have electrodes for connection with electronic elements, and a wiring region that is provided above the substrate and that has wires to supply various electrical signals to the electronic elements via the electrodes. At least three of the element forming regions are in contact with non-element-forming regions directly or via part of the wiring region, the electronic elements being not provided in the non-element-forming region.

According to an aspect of the present invention, the element forming regions are formed so as to sandwich the corresponding non-elopement forming regions. Thus, it is possible to uniformly arrange the element forming regions in the column and row directions of the active matrix substrate.

An active matrix substrate according to an aspect of the present invention includes a plurality of first element forming regions that are provided above a substrate and that have first electro-optical elements, a plurality of second element forming regions that are provided above the substrate and that have second electro-optical elements, and a plurality of non-element-forming regions that are provided above the substrate and that have no electro-optical elements. Each of the non-element forming regions may be arranged so as to be sandwiched by two of the first element forming regions and so as to be sandwiched by two of the second element forming regions.

According to an aspect of the present invention, the first element forming regions or the second element forming regions can be arranged so as to sandwich the corresponding non-element forming regions.

In the active matrix substrate of an aspect of the present invention, the non-element forming regions may have anti-reflection members.

In this case, since the anti-reflection members are formed in the non-element-forming regions, black can be displayed in the non-element-forming regions.

In the active matrix substrate of an aspect of the present invention, each of the first and second element forming regions may have an electronic circuit to drive the first or second electro-optical element that is provided therein.

With this arrangement, the first and second electro-optical elements provided in the first and second effective optical regions are driven by the electronic circuits provided in the same effective optical regions.

In the active matrix substrate of an aspect of the present invention, at least one of the first element forming regions and the second element forming regions may have an electronic circuit to drive the electro-optical element that is provided in another first or second element forming region.

With this arrangement, the electronic circuit to drive the first or second light-emitting film provided in the first or second light-emitting region can be formed in the first or second light-emitting region. As a result, the aperture ratio of pixels can be increased.

In the active matrix substrate of this exemplary embodiment, the non-element-forming region may have an electronic circuit to drive the electro-optical element that is provided in at least one of the first or second element forming regions.

With this arrangement, the individual electronic circuits to drive the first and second light-emitting films provided in the first and second light-emitting regions can be formed in the non-luminous regions. As a result, the aperture ratio of pixels can be increased.

An electronic apparatus according to an aspect of the present invention includes the electro-optical device as described above.

The electro-optical device can provide an electro-optical device that is reduced in directional viewing variation between the column and row directions.

The electronic apparatus of an aspect of the present invention incorporates the active matrix substrate as described above.

This electronic apparatus, therefore, includes the active matrix substrate suitable for the electro-optical device that is reduced in directional viewing variation between the column and row directions.

DETAILED DESCRIPTION OF PREFERRED EMBODIMENTS

First Exemplary Embodiment

Figure 1:
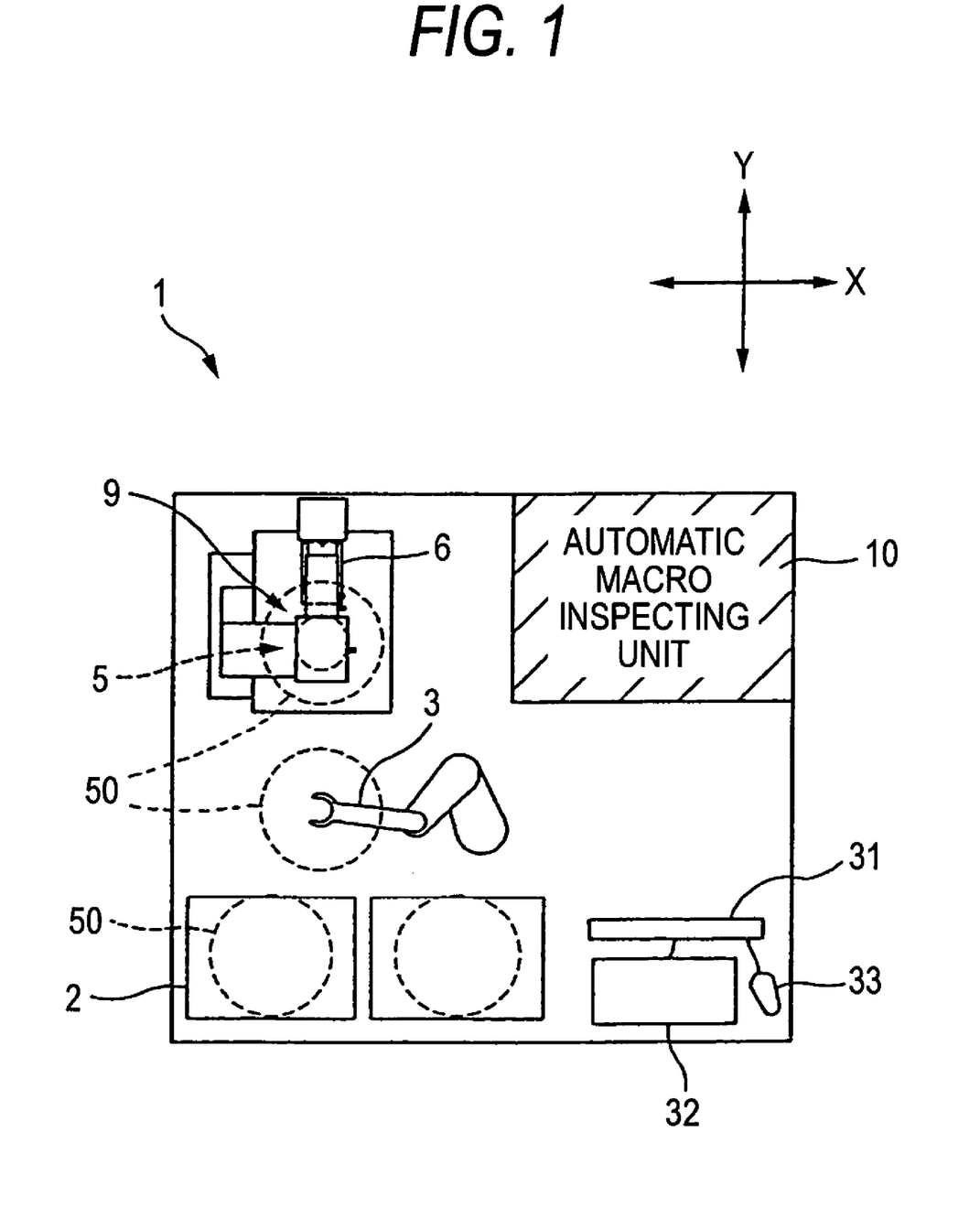
FIG. 1 is a circuit block schematic illustrating the circuit configuration of a display of a first exemplary embodiment.
Figure 2:
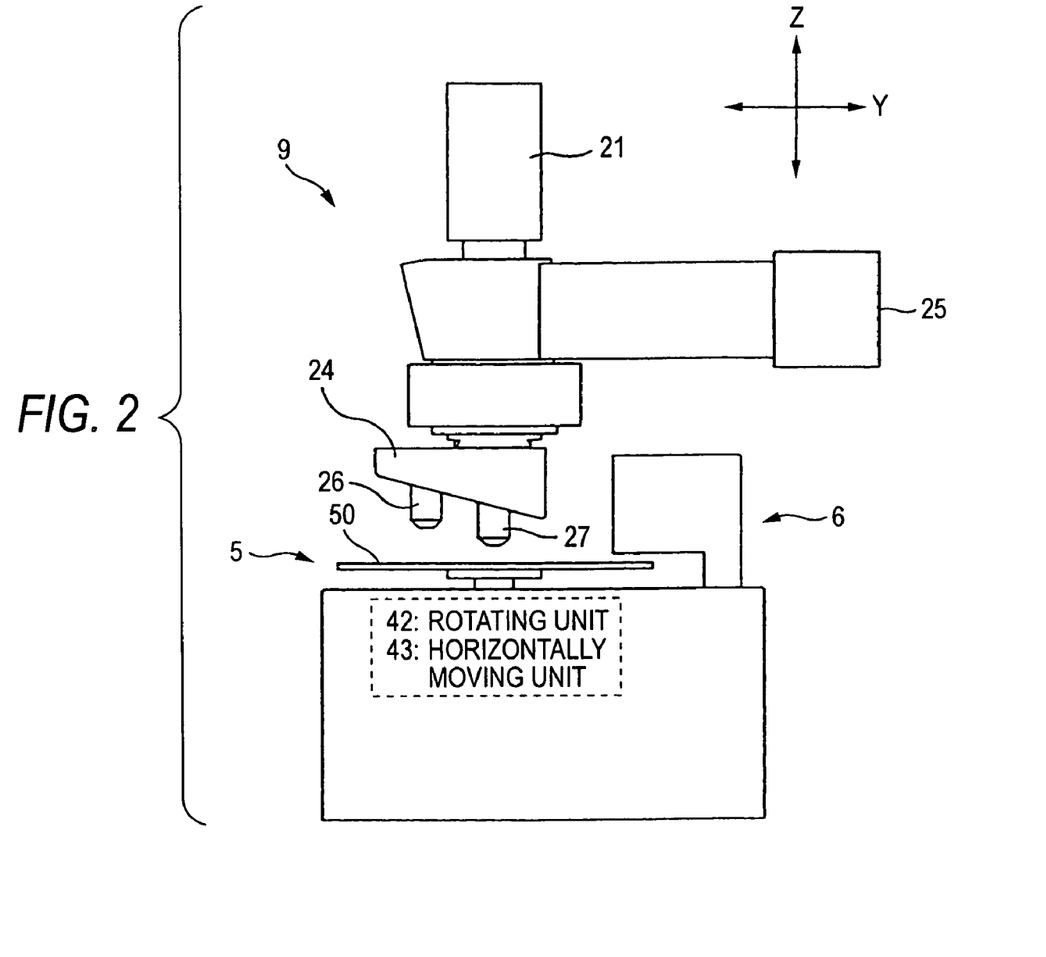
FIG. 2 is a circuit block schematic illustrating the internal circuit configuration of a display panel portion and a data-line drive circuit.
Figure 3A:
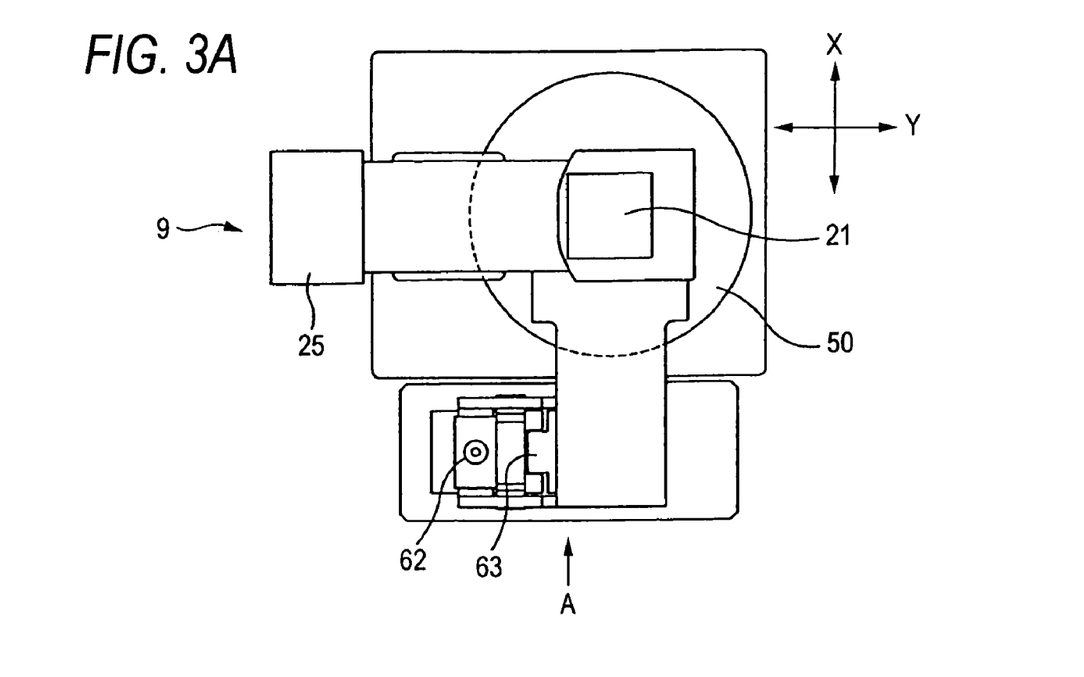
FIG. 3 is a circuit schematic of a pixel circuit in the first exemplary embodiment.
Figure 3B:
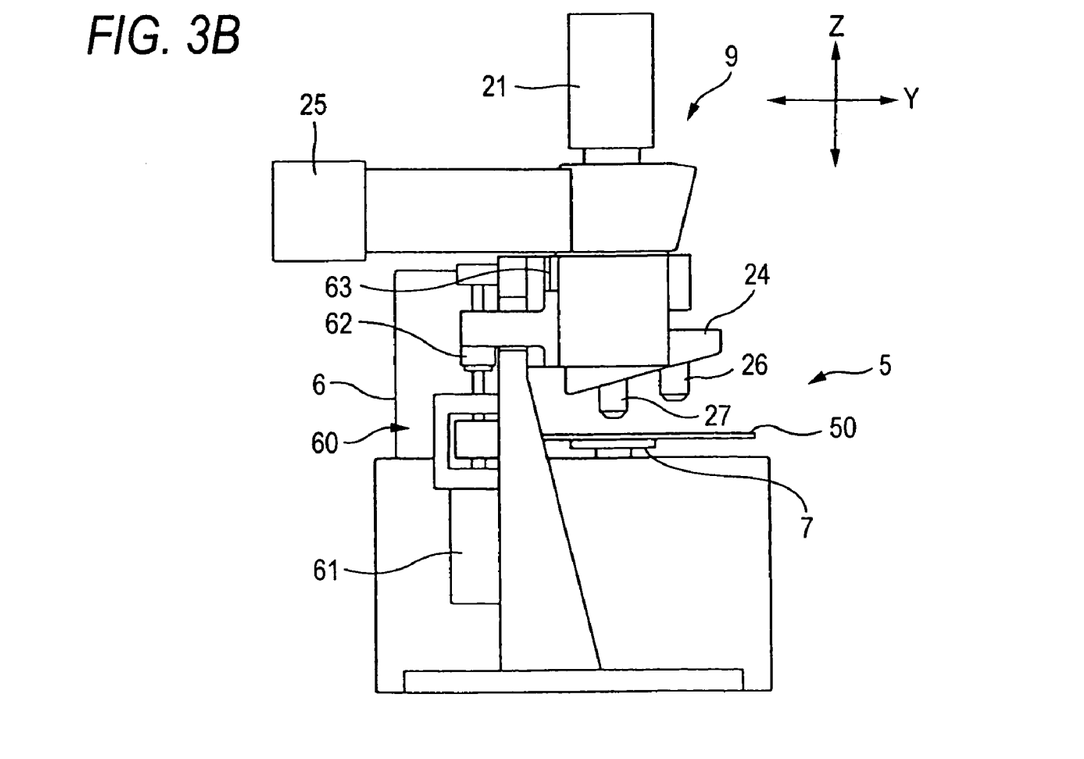

A first exemplary embodiment of the present invention will now be described below with reference to FIGS. 1 to 4. FIG. 1 is a circuit block schematic illustrating the circuit configuration of a display. FIG. 2 is a circuit block schematic illustrating the internal circuit configuration of a display panel portion and a data-line drive circuit. FIG. 3 is a circuit schematic of a pixel circuit.

A display 10 includes a control circuit 11, a display panel portion 12, a scan-line drive circuit 13, and a data-line drive circuit 14. The control circuit 11, the scan-line drive circuit 13, and the data-line drive circuit 14 in the display 10 may be constituted by electronic components that are independent from each other. For example, the control circuit 11, the scan-line drive circuit 13, and the data-line drive circuit 14 may each be constituted by a one-chip semiconductor integrated circuit unit. Alternatively, some or all of the control circuit 11, the scan-line drive circuit 13, and the data-line drive circuit 14 may be constituted by programmable IC chips, and the functions of the circuits may be realized through software, i.e., a program written in the IC chips.

The display panel portion 12 has a display area P, where a plurality of pixel circuits 20 are arranged and formed on an active matrix substrate S. As shown in FIG. 2, in the display panel portion 12, data lines are arranged so as to extend in the column direction thereof. The data lines are constituted by data lines XGm for green, data lines XBm for blue, and data lines XRm for red (m is a natural number). The green, blue, and red data lines XGm, XBm, and XRm are arranged in the order of a first green data line XG1, a first blue data line XB1, a first red data line XR1, a second green data line XG2, . . . and so on from the left end of the display panel portion 12. A plurality of scan lines Yn (n is a natural number) are also arranged so as to extend in the row direction of the display panel portion 12.

Further, the pixel circuits 20 are arranged and formed in a matrix at positions corresponding to the respective intersections of the scan lines Yn and the green, blue, and red data lines XGm, XBm, and XRm.

Each pixel circuit 20 is constituted by three types of pixel circuits, namely, a pixel circuit 20G for green, a pixel circuit 20B for blue, and a pixel circuit 20R for red. The green pixel circuit 20G has an organic EL (electroluminescent) element 21G for green. The organic EL element 21G emits green light from a light-emitting layer made of organic material. The blue pixel electrode 20B has an organic EL element 21B for blue. The organic EL element 21B emits blue light from a light-emitting layer made of organic material. The red pixel electrode 20R has an organic EL element 21R for red. The organic EL element 21R emits red light from a light-emitting layer made of organic material. A set of the green, blue, and red pixel circuits 20G, 20B, and 20R provides one pixel.

As shown in FIG. 3, in a region where each pixel circuit 20 is formed, a pixel forming region ZG for green, a pixel forming region ZB for blue, a pixel forming region ZR for red, and a dummy forming region ZS are provided in a square lattice. The green pixel forming region ZG has the green pixel circuit 20G and the organic EL element 21G therein emits green light. The blue pixel forming region ZB has the blue pixel circuit 20B and the organic EL element 21B therein emits blue light. The red pixel forming region ZR has the red pixel circuit 20R and the organic EL element 21R therein emits red light. In the dummy forming region ZS, none of the pixel circuits 20G, 20B, and 20R is formed, but an anti-reflection member made of black polyimide or the like is formed in this exemplary embodiment. Thus, black is displayed in the dummy forming region ZS. Thus, the formation of the dummy forming regions ZS can ensure that black is displayed on the display panel portion 12. As a result, the contrast ratio of the display 10 can be enhanced.

In this exemplary embodiment, all of the green pixel forming regions ZG, the blue pixel forming regions ZB, the red pixel forming regions ZR, and the dummy forming regions ZS have the same shape. Thus, in the green pixel forming region ZG, the blue pixel forming region ZB, the red pixel forming region ZR, and the dummy forming region ZS, all of the corresponding organic EL elements 21G, 21B, and 21R can be formed on the same condition. As a result, coating spots generated during the formation of the organic EL elements 21G, 21B, and 21R can be reduced.

With regard to the arrangement of the forming regions ZG, ZB, ZR, and ZS (pixel circuits 20G, 20B, and 20R) allotted in a square lattice in this exemplary embodiment, as shown in FIGS. 2 and 3, each upper left side is allotted to the green pixel forming regions ZG, and each upper right side is allotted to the blue pixel forming region ZB. Also, each lower left side is allotted to the dummy forming region ZS and each lower right side is allotted to the red pixel forming region ZR.

That is, except for the pixel circuits 20 that are located at the top, bottom, left, and right edges, the dummy forming regions ZS of the pixel circuits 20 are arranged so as to be sandwiched by the green pixel forming regions ZG in the vertical direction (column direction). The dummy forming regions ZS are also arranged so as to be sandwiched by the red pixel forming regions ZR in the horizontal direction (row direction). The green pixel forming region ZG, the blue pixel forming region ZB, the red pixel forming region ZR, and the dummy forming region ZS, which are formed in a square lattice, constitute one pixel region. As a result, the green, blue, and red organic EL elements 21G, 21B, and 21R can be arranged in regular directions and at regular intervals in the column and row directions of the display panel portion 12. Thus, this arrangement can reduce directional viewing variation that occurs between the column direction and the row direction of the display panel portion 12, which makes it possible to suppress the distortion of an image displayed on the display panel portion 12.

As shown in FIG. 3, the green pixel circuit 20G formed in the green pixel forming region ZG in each pixel circuit 20 has a driving transistor QdG, a switching transistor Qs, and a storing capacitor Co that serves as a capacitance element. The driving transistor QdG is constituted by a p-channel FET (field effect transistor). The switching transistor Qs is constituted by an n-channel FET.

The drain of the driving transistor QdG is connected to the anode of the organic EL element 21G that emits green light, and the source of the driving transistor QdG is connected to a power-supply line LG for green. An operating voltage VG for green is applied to the power-supply line LG. The storing capacitor Co is connected between the gate and the source of the driving transistor QdG.

The gate of the switching transistor Qs in the green pixel circuit 20G is connected to the corresponding scan line Yn. The drain of the switching transistor Qs is connected to the green data line XGm, which is a part of data lines Xm, and the source of the switching transistor Qs is connected to the gate of the driving transistor QdG.

Similarly, the blue pixel circuit 20B formed in each blue pixel-forming region ZB has the driving transistor QdB, the switching transistor Qs, and the storing capacitor Co. The driving transistor QdB is constituted by a p-channel FET. The switching transistor Qs is constituted by an n-channel FET.

The drain of the driving transistor QdB is connected to the anode of the organic EL element 21B that emits blue light, and the source of the driving transistor QdB is connected to a power-supply line LB for blue. An operating voltage VB for blue is applied to the power-supply line LB. The storing capacitor Co is connected between the gate and the source of the driving transistor QdB.

The gate of the switching transistor Qs in the blue pixel circuit 20B is connected to the corresponding scan line Yn. The drain of switching transistor Qs is connected to the blue data line XBm, which is a part of the data lines Xm, and the source of the switching transistor Qs is connected to the gate of the driving transistor QdB.

The red pixel circuit 20R formed in each red pixel-forming region ZR also has the driving transistor QdR, the switching transistor Qs, and the storing capacitor Co. The driving transistor QdR is constituted by a p-channel FET. The switching transistor Qs is constituted by an n-channel FET.

The drain of the driving transistor QdR is connected to the anode of the organic EL element 21R that emits red light, and the source of the driving transistor QdR is connected to a power-supply line LR for red. An operating voltage VR for red is applied to the power-supply line LR. The storing capacitor Co is connected between the gate and the source of the driving transistor QdR. The other end of the storing capacitor Co is connected to the power-supply line LR for red.

The gate of the switching transistor Qs in the red pixel circuit 20R is connected to the corresponding scan line Yn. The drain of the switching transistor Qs is also connected to the red data line XRm, which is a part of the data lines Xm, and the source of the switching transistor Qs is connected to the gate of the driving transistor QdR.

Figure 4A:
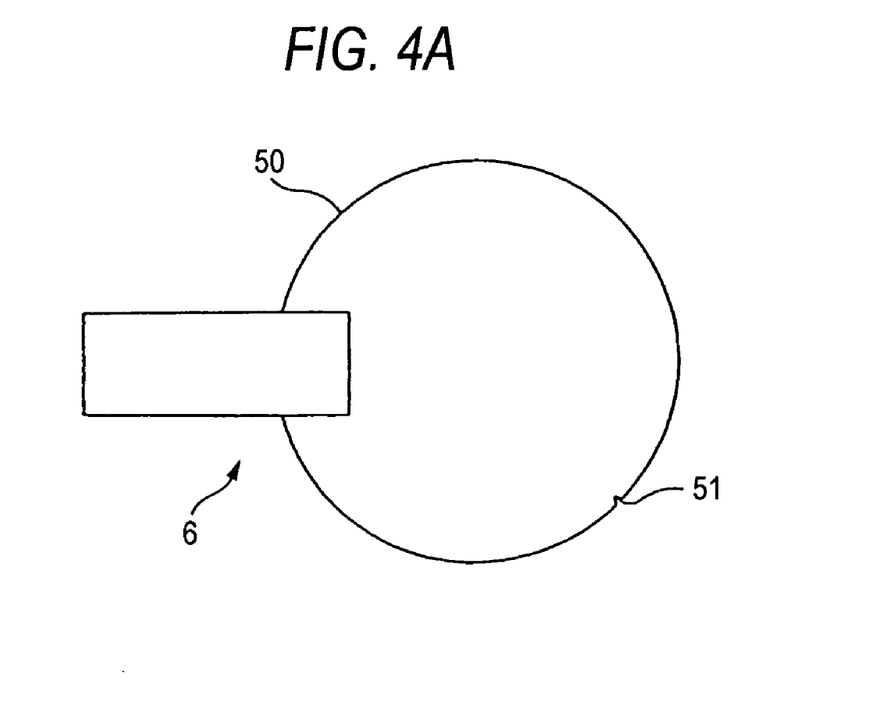
FIG. 4 is a partial sectional view of a display panel portion in the first exemplary embodiment.
Figure 4B:
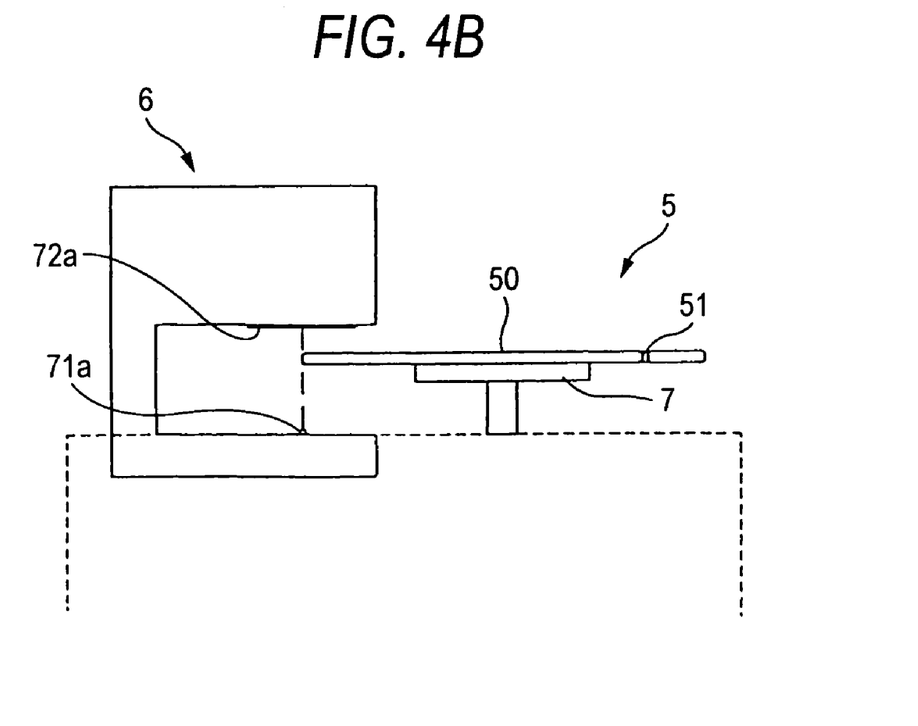

The active matrix substrate S will now be described in detail with reference to FIG. 4. FIG. 4 is a partial sectional view of the display panel portion 12 including the dummy forming regions ZS and the green pixel forming regions ZG that are arranged adjacent thereto. The partial sectional view shown in FIG. 4 corresponds to the section along the plane A-A shown in FIG. 3 in which the driving transistors QdG, which are included in the pixel circuits 20G in the green pixel forming regions ZG, are formed. Since the blue and red pixel forming regions ZB and ZR also have structures similar to that of the green pixel forming regions ZG, the descriptions thereof will be omitted.

As shown in FIG. 4, the display panel portion 12 includes a substrate Sd, an element forming layer DZ that is provided above the substrate Sd, and green light-emitting films LFG and non-luminous films NLF which are provided on the element forming layer DZ. The green light-emitting films LFG constitute the green organic EL elements 21G. The element forming layer DZ is a layer where the green pixel circuits 20G are formed so as to correspond to the green light-emitting films LFG. Further, the element forming layer DZ is a layer where the other blue and red pixel circuits 20B and 20R are formed so as to correspond to blue and red light emitting films, which are not shown, as well as the green pixel circuits 20G.

The element forming layer DZ has the driving transistors QdG, QdB, and QdR, which are included in the corresponding pixel circuits 20G, 20B, and 20R. The element forming layer DZ has wires to electrically connect the green light-emitting films LFG, the blue and red light emitting films, and the driving transistors QdG, QdB, and QdR. The region in which the wires are formed will be referred to as a "wiring region" in this exemplary embodiment.

The substrate Sd is made of silicon in this exemplary embodiment. An insulating layer 31 is formed on the substrate Sd. The insulating layer 31 has a first insulating film 31a and a second insulating film 31b which are made of silicon dioxide. The pixel circuits 20R, 20G, and 20B are not formed on the first insulating film 31a below the region where the non-luminous films NLF are formed (i.e., the dummy forming regions ZS).

On the other hand, various elements that constitute the green pixel circuits 20G are formed below the regions (i.e., the green pixel forming regions ZG) where the green light-emitting films LFG are formed. Examples of the various elements include silicon portions T that constitute the gates, source, and drains of the driving transistors QdR.

The second insulating film 31b is formed on the silicon portions T and the first insulating film 31a. On the second insulating film 31b, gate electrodes 33G of the driving transistors QdR are formed at positions opposing the silicon portions T. Also, on the second insulating film 31b, drain electrodes 33D and source electrodes 33S are formed at positions opposing the drains and the sources of the silicon portions T.

A first interlayer insulating film 32a is formed on the second insulating film 31b. A second interlayer insulating film 32b is formed on the first interlayer insulating film 32a. The second interlayer insulating film 32b includes wires 35a, which electrically connect the corresponding drain electrode 33D and pixel electrodes 34, and wires 35b, which electrically connect the source electrodes 33S, the power supply lines LR, and the storing capacitors Co.

On the second interlayer insulating film 32b, the pixel electrodes 34 and first banks 36a are formed, and the first banks 36a are made of inorganic material, and to electrically insulate the individual pixel electrodes 34 from each other. A part of each pixel electrode 34 has an opening. The non-luminous films NLF, which are made of black polyimide, and the green light-emitting films LFG are formed on the corresponding pixel electrodes 34 so as to cover the positions of the openings of the pixel electrodes 34. The pixel electrodes 34 for the non-luminous films NLF are not connected to the driving transistors. The second interlayer insulating film 32b is evenly formed in the regions where the green light-emitting films LFG are formed and the regions where the non-luminous films NLF are formed. The second interlayer insulating film 32b is evenly formed also in the regions where the blue and red light-emitting films, not shown, other than the green light-emitting films LFG, are formed as in the regions where the non-luminous films NLF are formed. Thus, the display area P in which the pixel circuits 20 are arranged and formed can be planarized. As a result, color irregularities of pixels can be eliminated.

Second banks 36b, which are made of organic material, are formed on the first banks 36a. The second banks 36b serve to provide isolation between the green light-emitting films LFG and the non-luminous films NLF. A first cathode layer 38a is formed on the green light-emitting films LFG, the non-luminous films NLF, and the second banks 36b. A second cathode layer 38b is formed on the first cathode layer 38a. The first and second cathode layers 38a and 38b constitute a cathode layer 38. The cathode layer 38 serves as an opposing electrode for the pixel electrodes 34 to supply electrical current to the green light-emitting films LFG.

Thus, as described above, the regions where the green light-emitting films LFG and the blue and red light-emitting films are provided and the regions where the non-luminous films NLF are provided are evenly formed, thereby making it possible to suppress color irregularities of the pixels.

As shown in FIG. 2, the data-line drive circuit 14 includes single-line drive circuits 23G for green, single-line drive circuits 23B for blue, and single-line drive circuits 23R for red for the individual data lines Xm.

Each green single-line drive circuit 23G supplies a green data signal VDG to the corresponding green pixel circuit 20G via the green data line XGm, which is a part of the data lines Xm, in accordance with a data control signal from the control circuit 11. When the internal state (the amount of charge in the storing capacitor Co) of the green pixel circuit 20G is set in accordance with the green data signal VDG, the value of current flowing through the organic EL element 21G is controlled correspondingly.

Each blue single-line drive circuit 23B supplies a blue data signal VDB to the corresponding blue pixel circuit 20B via the blue data line XBm, which is a part of the data lines Xm, in accordance with a data control signal from the control circuit 11. When the internal state (the amount of charge in the storing capacitor Co) of the blue pixel circuit 20B is set in accordance with the blue data signal VDB, the value of current flowing through the organic EL element 21B is controlled correspondingly.

Each red single-line drive circuit 23R supplies a red data signal VDR to the corresponding red pixel circuit 20R via the red data line XRm, which is a part of the data lines Xm, in accordance with a data control signal from the control circuit 11. When the internal state (the amount of charge in the storing capacitor Co) of the red pixel circuit 20R is set in accordance with the red data signal VDR, the value of current flowing through the organic EL element 21R is controlled correspondingly.

The scan-line drive circuit 13 appropriately selects one of the scan lines Y1 to Yn to select a group of pixel circuits 20 in one row. The scan-line drive circuit 13 is adapted to appropriately select one of the scan lines Y1 to Yn in accordance with a scan control signal from the control circuit 11 and to output a scan signal corresponding to the one line.

In turn, the switching transistors Qs of the pixel circuits 20 (the pixel circuits 20G, 20B, and 20R) that are provided on the scan line selected by the scan signal are turned on. At this point, the green, blue, and red data signals VDG, VDB, and VDR are supplied to the corresponding storing capacitors Co via the data lines XGm, XBm, and XRm.

The control circuit 11 converts display data (image data) sent from an external device into matrix data representing tones of light emitted by each organic EL element 21. The matrix data contains a scan control signal to specify a scan line to output the scan signal to select a group of pixel electrodes in one row and also contains a data control signal to determine the green, blue, and red data signal VDG, VDB, and VDR to set the brightness of the organic EL elements 21G, 21B, and 21R of the selected group of pixel electrodes. The scan control signal is supplied to the scan-line drive circuit 13. The data control signal is supplied to the data-line drive circuit 14.

According to the display 10 of this exemplary embodiment, the individual scan lines Yn are sequentially selected and the green, blue, and red data signals VDG, VDB, and VDR are supplied via the corresponding data lines XGm, XBm, and XRm to the corresponding storing capacitors Co of the pixel circuits 20 (the pixel circuits, 20G, 20B, and 20R) on the selected scan lines Yn. Correspondingly, the organic EL elements 21G, 21B, and 21R of the pixel circuits 20G, 20B, and 20R emit light, thereby displaying an image.

An electro-optical device recited in the claims corresponds to, for example, the display 10 in this exemplary embodiment. Also, electronic elements, a first electro-optical element, and a second electro-optical element recited in the claims correspond to, for example, two organic EL elements selected from the organic EL elements 21G, 21B, and 21R in this exemplary embodiment. Further, a first effective optical region or a first light emitting region and a second effective optical region or a second light emitting region recited in the claims correspond to, for example, two pixel forming regions selected from the green, blue, and red pixel forming regions ZG, ZB, and ZR in this exemplary embodiment. An ineffective optical region recited in the claims corresponds to the dummy forming region ZS, for example, in this exemplary embodiment.

A first light-emitting film and a second light-emitting film recited in the claims correspond to, for example, two light-emitting films selected from the green light-emitting film LFG, blue light-emitting film, and red light-emitting film in this exemplary embodiment. Electronic circuits, first transistors, second transistors, and capacitance elements recited in the claims correspond to, for example, the pixel circuits 20, the switching transistors Qs, the green, blue, and red driving transistors QdG, QdB, QdR, and the storing capacitors Co, respectively, in this exemplary embodiment. A substrate, first element forming regions, second element forming regions, and non-element-forming regions recited in the claims correspond to, for example, the active matrix substrate S, the green, blue, and red pixel-forming regions ZG, ZB, and ZR, and the dummy forming regions ZS, respectively, in this exemplary embodiment. Electrodes recited in the claims correspond to, for example, the pixel electrodes 34 in this exemplary embodiment.

The display 10 of this exemplary embodiment can provide the following advantages.

(1) In this exemplary embodiment, in each pixel region of the display panel portion 12, the green pixel forming region ZG having the green pixel circuit 20G including the green organic EL element 21G, is allotted to the upper left side, and the blue pixel forming region ZB having the blue pixel circuit 20B including the blue organic EL element 21B, is allotted to the upper right side. Also, the dummy forming region ZS that does not have any of the color pixel circuits but has the anti-reflection member, is allotted to the lower left side, and the red pixel forming region ZR having the red pixel circuit 20R including the red organic EL element 21R, is allotted to the lower right side. Further, in the adjacent pixel circuits 20, except for the pixel circuits 20 that are located at the top, bottom, left, and right edges, the green pixel forming regions ZG, the blue pixel forming regions ZB, the red pixel forming regions ZR, and the dummy forming regions ZS are arranged in a positional relationship in which another forming region is provided between two adjacent same-color forming regions. Thus, since two adjacent same-color organic EL elements 21G, 21B, and 21R are arranged at regular intervals in the column and row directions with one forming region interposed therebetween, it is possible to reduce directional viewing variation that occurs between the column direction and the row direction of the display panel portion 12.

(2) In this exemplary embodiment, each dummy forming region ZS has an anti-reflection member. This can ensure that black is displayed on the display panel portion 12.

Thus, this exemplary embodiment can provide a display having a high contrast ratio compared to the known configuration.

(3) In this exemplary embodiment, all of the green pixel forming regions ZG, the blue pixel forming regions ZB, the red pixel forming regions ZR, and the dummy forming regions ZS have the same shape. Thus, it is possible to reduce coating spots that result from the formation of the organic EL elements 21G, 21B, and 21R in the corresponding green pixel forming region ZG, the blue pixel forming regions ZB, and the red pixel forming regions ZR.

(4) In this exemplary embodiment, in the active matrix substrate S, the regions where the green light-emitting film LFG and the blue and red light-emitting films are provided and the regions where the non-luminous films NLF are provided are evenly formed. As a result, color irregularities of the pixel electrodes can be reduced.

Second Exemplary Embodiment

A second exemplary embodiment of the present invention will now be described below with reference to FIG. 5. The second exemplary embodiment is analogous to the first exemplary embodiment except that the formation positions of the pixel circuits 20G, 20B, and 20R in the first exemplary embodiment are different. Thus, in the second exemplary embodiment, the same members as those in the first exemplary embodiment are denoted with the same reference characters and detailed descriptions thereof will be omitted.

Figure 5:
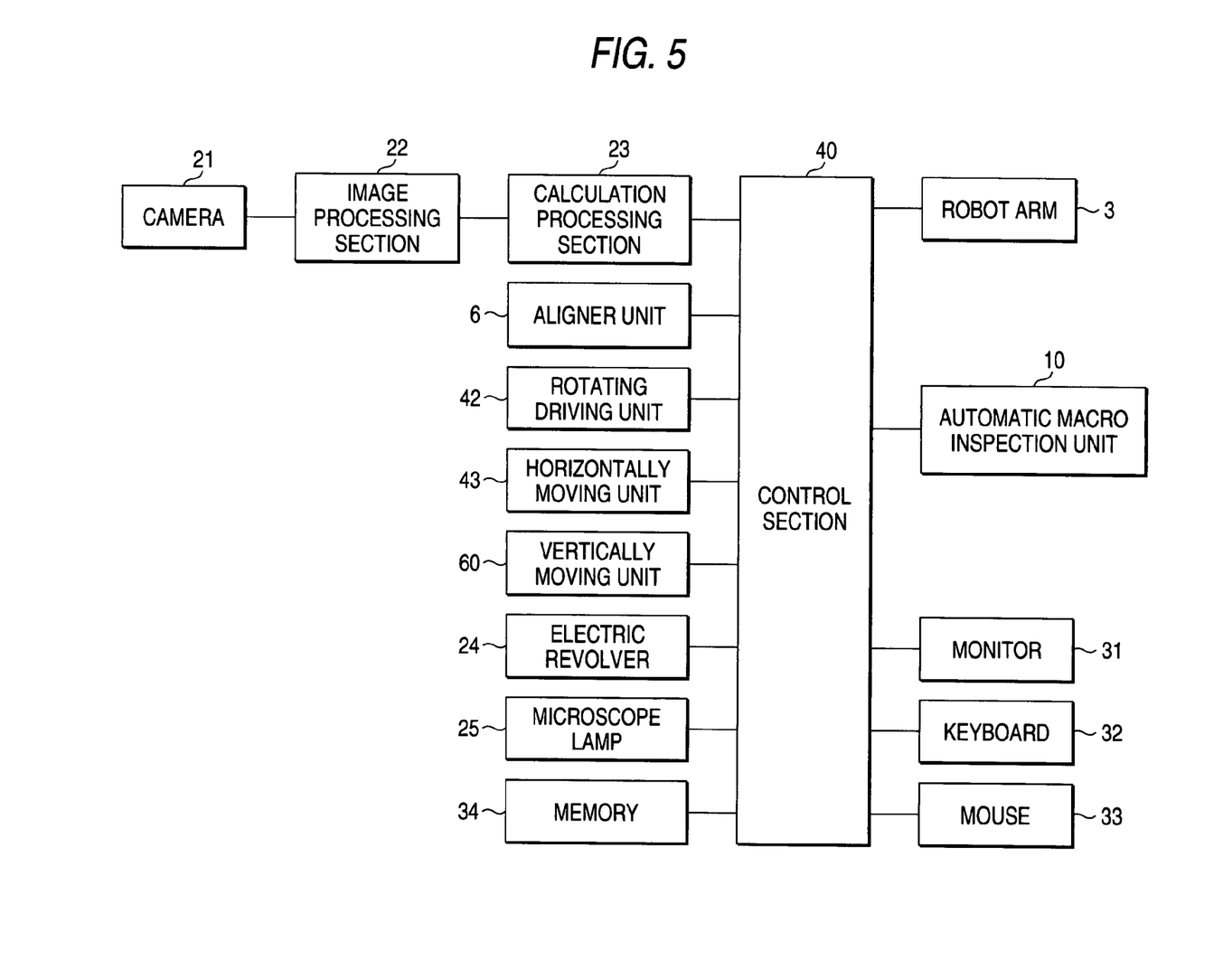
FIG. 5 is a circuit schematic of a pixel circuit in a second exemplary embodiment.

FIG. 5 is a circuit schematic of pixel circuits 30 that are formed at positions corresponding to the intersections of the scan lines Yn and the green, blue, and red data lines XGm, XBm, and XRm. Each pixel circuit 30 includes four forming regions, i.e., a green pixel forming region ZG, a blue pixel forming region ZB, a red pixel forming region ZR, and a dummy forming region ZS.

In the green pixel forming region ZG, a green organic EL element 21G is arranged and formed. In the dummy forming region ZS, a green pixel circuit 20G, which includes a switching transistor Qs, a storing capacitor Co, and a green driving transistor QdG, except for the green organic EL element 21G, is formed. In the blue pixel forming region ZB, a blue organic EL element 21B is formed. In the red pixel forming region ZR, a blue pixel circuit 20B, which includes a switching transistor Qs, a storing capacitor Co, and a blue driving transistor QdB, except for the blue organic EL element 21B, is formed.

Thus, the aperture ratios in the green pixel forming region ZG and the blue pixel forming region ZB can be increased.

In the red pixel forming region ZR, a red organic EL element 21R is formed. The blue circuit 20B, except for the blue organic EL element 21B, is formed in the red pixel forming region ZR.

In the dummy forming region ZS, the green pixel circuit 20G, except for the green organic EL element 21G is formed. Further, in the dummy forming region ZS, a red pixel circuit 20R, which includes a switching transistor Qs, a storing capacitor Co, and a red driving transistor QdR, except for the red organic EL element 21R, is formed.

In the dummy forming region ZS, an anti-reflection member made of black polyimide or the like is provided. Thus, the dummy forming region ZS displays black in the same manner as the first exemplary embodiment.

That is, except for the pixel circuits 30 that are located at the top, bottom, left, and right edges of the display panel portion 12, the green pixel forming regions ZG, the blue pixel forming regions ZB, the red pixel forming regions ZR, and the dummy forming regions ZS of the pixel circuits 30 are formed in a matrix in a positional relationship in which another forming region is provided between two same-color forming regions. Thus, two same-color organic EL elements 21G, 21B, and 21R are formed at positions apart from each other with one forming region interposed therebetween at regular intervals in the vertical and horizontal directions.

Figure 6:
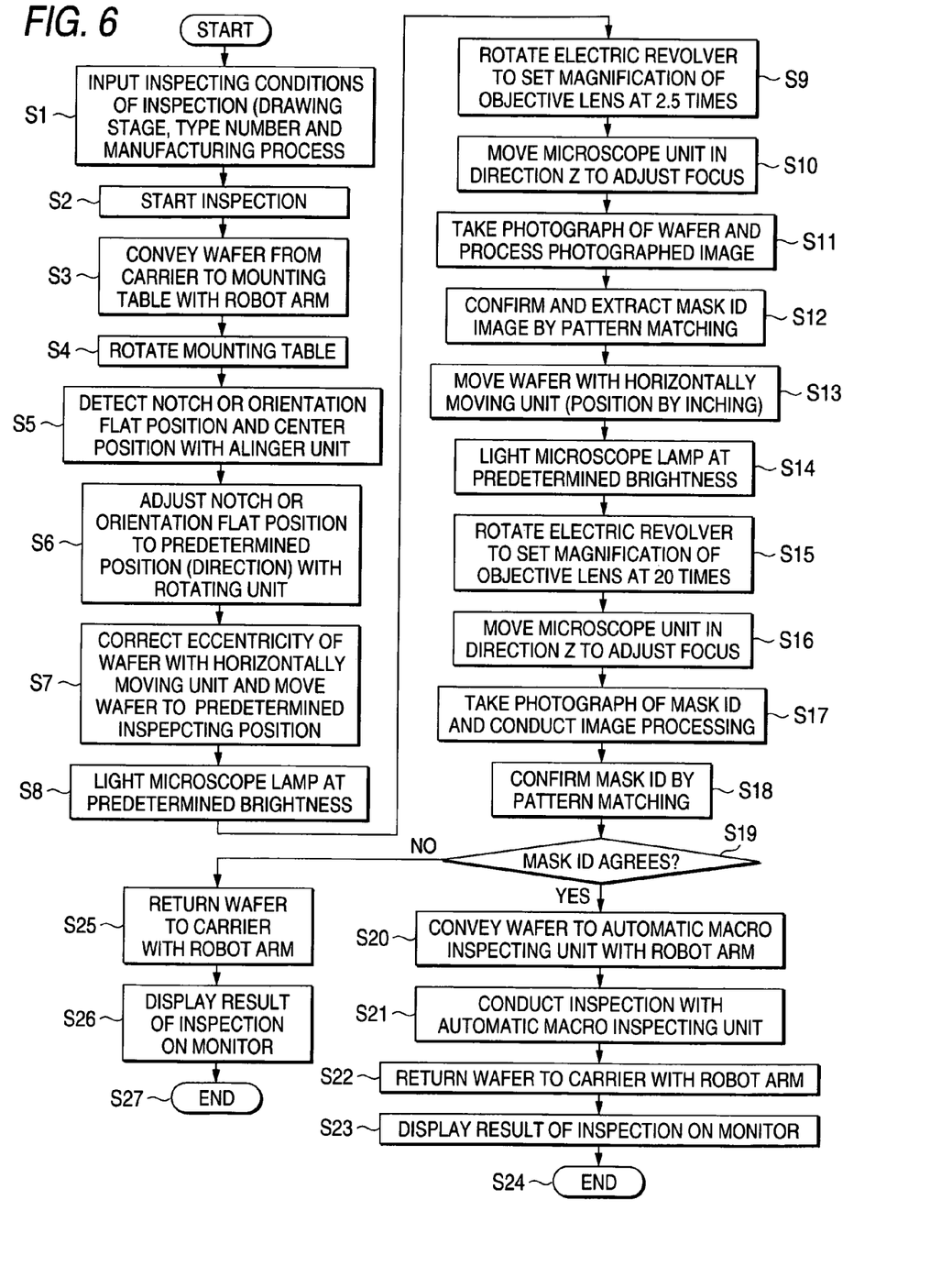
FIG. 6 is a partial sectional view of a display panel portion in the second exemplary embodiment.

The structure of the active matrix substrate S in the second exemplary embodiment will now be described with reference to FIG. 6. FIG. 6 is a partial sectional view of the display panel portion 12 including the dummy forming region ZS and the green pixel forming region ZG that is arranged adjacent thereto. The partial sectional view shown in FIG. 6 corresponds to the section along the plane B-B shown in FIG. 5 in which two driving transistors QdG and QdR, which are included in the green and red pixel circuits 20G and 20R, are formed.

As shown in FIG. 6, the display panel portion 12 includes a substrate Sd, a green light-emitting film LFG and a non-luminous film NLF which are formed above the substrate, and an element forming layer DZ formed between the substrate Sd and the green light-emitting film LFG and the non-luminous film NLF. The element forming layer DZ has the pixel circuit 20R, 20G, and 20B. As in the first exemplary embodiment, the element forming layer DZ has the driving transistors QdG, QdB, and QdR, which are included in the corresponding pixel circuits 20G, 20B, and 20R. The element forming layer DZ has wires to electrically connect the green light-emitting film LFG, the blue and red light emitting films, and the driving transistors QdG, QdB, and QdR. The region in which the wires are formed will be referred to as a "wiring region" in this exemplary embodiment as well.

An insulating layer 31 is formed on the substrate Sd. The insulating layer 31 includes a first insulating film 31a and a second insulating film 31b which are made of silicon dioxide. On the first insulating film 31a, silicon portions T are formed below the position where the non-luminous film NLF is formed. The silicon portions T constitute the corresponding gates, sources, drains of the driving transistors QdG and QdR included in the green pixel circuit 20G and the red pixel circuit 20R. The second insulating film 31b is formed on the silicon portions T and the first insulating film 31a. On the second insulating film 31b, the gate electrodes 33G of the driving transistors QdG and QdR are formed at positions opposing the silicon portions T. Also, drain electrodes 33D and source electrodes 33S are formed at positions corresponding to the drains and the sources of the respective silicon portions T.

A first interlayer insulating film 32a is formed on the second insulating film 31b. A second interlayer insulating film 32b is formed on the first interlayer insulating film 32a. The second interlayer insulating film 32b includes wires 35a, which electrically connect the drain electrodes 33D and pixel electrodes 34, and wires 35b, which electrically connect the source electrodes 33S, the power supply lines LR, and the storing capacitors Co.

On the second interlayer insulating film 32b, first banks 36a, which are made of inorganic material, are formed between the pixel electrodes 34 to provide electrical insulations between the pixel electrodes 34. A part of each pixel electrode 34 has an opening. The light-emitting films LFD and the non-luminous films NLF are formed on the corresponding pixel electrodes 34 so as to cover the positions of the openings of the pixel electrodes 34. Second banks 36*b*, which are made of organic material, are formed on the first banks 36*a*. The second banks 36*b* serve to provide isolations between the green light-emitting films LFG and the non-luminous films NLF. A cathode layer 38*a* is formed on the green light-emitting films LFG, the non-luminous films NLF, and the second banks 36*b*. A second cathode layer 38*b* is formed on the first cathode layer 38*a*. The first and second cathode layers 38*a* and 38*b* constitute a cathode layer 38. This cathode layer 38 serves as an opposing electrode for the pixel electrodes 34 to supply electrical current to the green light-emitting films LFG.

Thus, the regions where the green light-emitting films LFG are provided and the regions where the non-luminous films NLF are provided can be planarized. As a result, color irregularities of the pixels can be reduced.

Thus, in addition to the advantages of the first exemplary embodiment, the second exemplary embodiment can increase the aperture ratios in the red pixel forming region ZR and the blue pixel forming region ZB compared to the known configuration. As a result, a display having reduced power consumption can be provided.

Further, the formation of the pixel elements, which control the green and red organic EL elements 21G and 21R, in the dummy forming region ZS can reduce the area of the pixel circuit 30. Thus, a high-definition display can be provided.

Third Exemplary Embodiment

An electronic apparatus incorporating the display 10, which serves as an electro-optical device and which is described in the first or second exemplary embodiments, will now be described with reference to FIGS. 7 and 8. The display 10 is applicable to various electronic apparatuses, such as mobile personal computers, portable telephones, and digital cameras.

Figure 7:
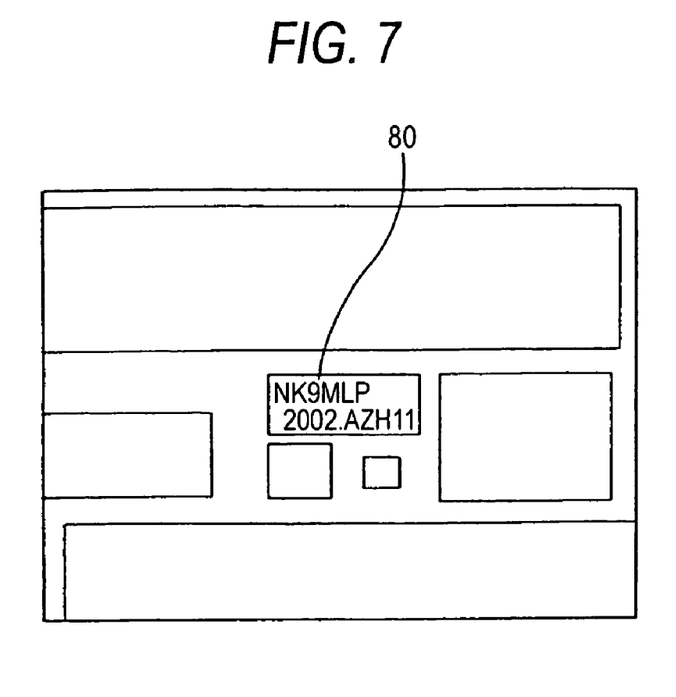
FIG. 7 is a perspective view illustrating the configuration of a mobile personal computer according to a third exemplary embodiment.

FIG. 7 is a perspective view of the configuration of a mobile personal computer. Referring to FIG. 7, a personal computer 50 includes a main unit 52, which has a keyboard 51, and a display unit 53, which incorporates the display 10. In this case, the display unit 53 incorporating the display 10 provides the same advantages as the exemplary embodiments described above. As a result, it is possible to provide a mobile personal computer 50 having the display 10 that is reduced in color irregularities, high in contrast, superior in display quality, and low in power consumption compared to a known personal computer.

Figure 8:
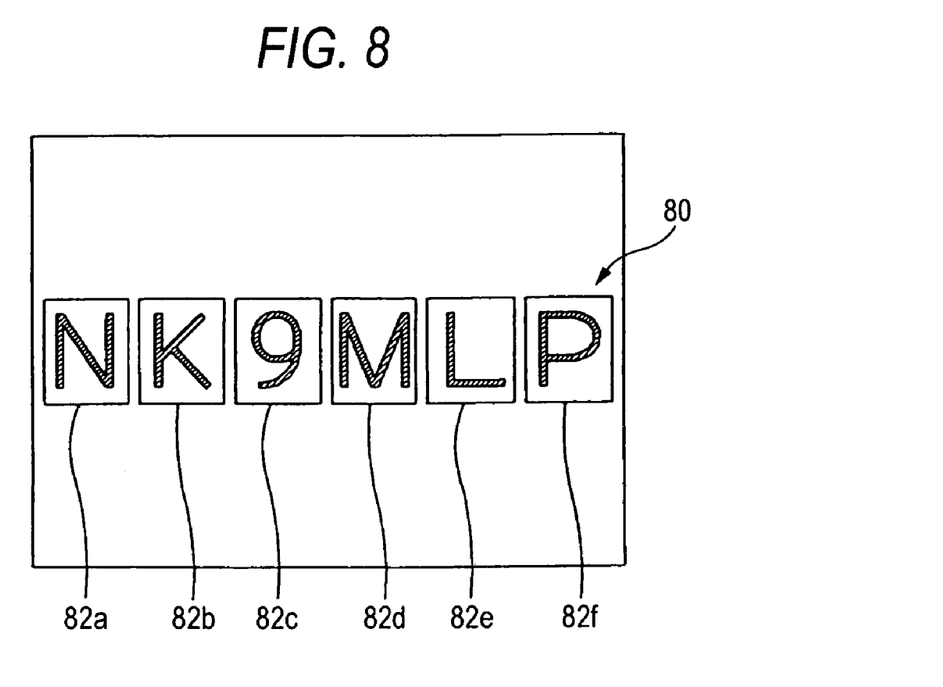
FIG. 8 is a perspective view illustrating the configuration of a portable telephone according to the third exemplary embodiment.
Figure 9A:
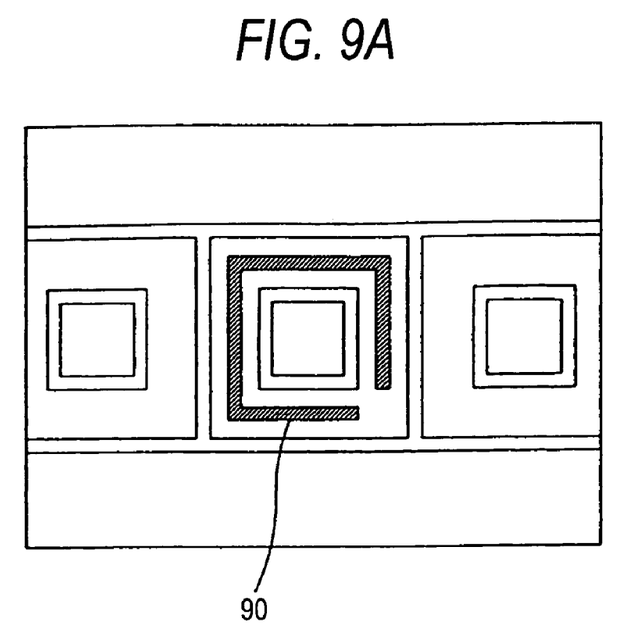
Figure 9B:
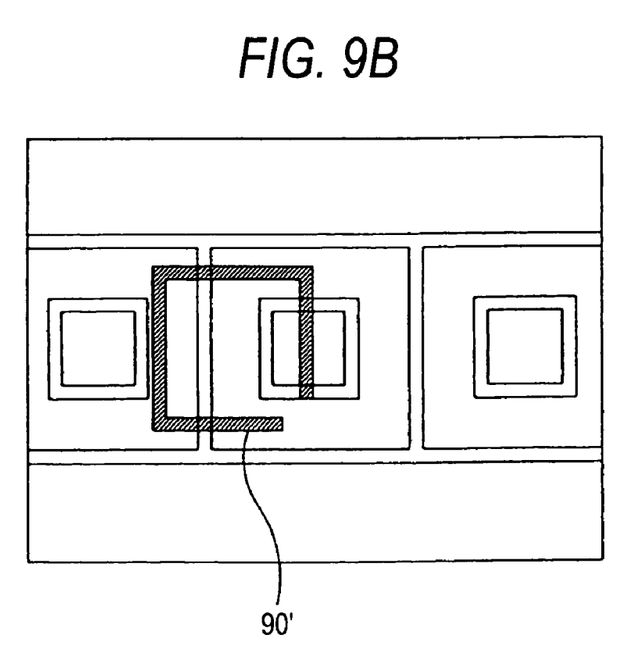

FIG. 8 is a perspective view of the configuration of a portable telephone. Referring to FIG. 8, a portable telephone 60 includes a plurality of operation buttons 61, an earpiece 62, a mouthpiece 63, and a display unit 64 that incorporates the display 10. In this case as well, the display unit 64 incorporating the display 10 provides the same advantages as the exemplary embodiments described above. As a result, it is possible to provide a portable telephone 60 having the display 10 that is reduced in color irregularities, high in contrast, and superior in display quality compared to a know portable telephone.

The present invention is not limited to the above-described exemplary embodiments.

For example, in the illustrated exemplary embodiments, the green pixel forming region ZG and the blue pixel forming region ZB are allotted to the upper left side and the upper right side of the display panel portion 12, respectively. Further, the dummy forming region ZS and the red pixel forming region ZR are allotted to the lower left side and the lower right side, respectively. Instead, for example, the red pixel forming region ZR and the green pixel forming region ZG may be allotted to the upper left side and the upper right side of the display panel portion 12, respectively. Further, the dummy forming region ZS and the blue pixel forming region ZB may be allotted to the lower left side and the lower right side, respectively.

That is, the formation positions of the green pixel-forming regions ZG, the blue pixel-forming regions ZB, the dummy forming regions ZS, and the red pixel-forming regions ZR which constitute the pixel circuits 20 are not limited. Thus, any arrangement may be used as long as two adjacent same-color organic elements 21G, 21B, and 21R are arranged at regular intervals in the vertical and horizontal directions with one forming region interposed therebetween.

In the second exemplary embodiment, the driving transistors QdG and QdR to control the green and red organic EL elements, the storing capacitors Co, and the switching transistors Qs are formed in the dummy forming regions ZS. Also, the driving transistors QdB to control the blue organic EL elements 21B, the storing capacitors Co, and the switching transistors Qs are formed in the red pixel-forming regions ZR.

Instead, the driving transistors, QdG, QdB and QdR to control the green, blue, and red organic EL elements 21G, 21B, and 21R, the storing capacitors Co, and the switching transistors Qs may be formed in the dummy forming regions ZS. With this arrangement, it is possible to further increase the aperture ratios in the green pixel-forming regions ZG, the blue pixel-forming regions ZB, the dummy forming regions ZS, and the red pixel-forming regions ZR. As a result, a display having reduced power consumption can be provided.

In the above exemplary embodiments, although the driving transistors QdG, QdB, and QdR are each constituted by a p-channel FET and the switching transistors Qs are each constituted by a p-channel FET, the present invention is not limited thereto. For example, the driving transistors QdG, QdB, and QdR and the switching transistors Qs may be each constituted by a p-channel FET.

In the above exemplary embodiments, although the pixel circuits 20 and 30 are embodied as electronic circuits to provide preferable advantages, they maybe embodied as electronic circuits to drive electro-optical elements, for example, light-emitting elements, such as LED or FED, other than the organic EL elements 21G, 21B, and 21R.

In the above exemplary embodiments, the electro-optical elements of the pixel circuits 20 are embodied as the organic EL elements 21G, 21B, and 21R, they may be embodied as inorganic EL elements. That is, the electro-optical elements may be applied to an inorganic EL display having inorganic EL elements.

What is claimed is:

1. An electro-optical device comprising:
  a substrate;
  a plurality of effective optical regions and a plurality of ineffective-optical regions provided in a square lattice above the substrate, the square lattice having a column direction and a row direction;
  electro-optical elements provided in the effective optical regions and not provided in the ineffective-optical regions;
  a wiring region provided on the substrate, wires to supply power or electric signals to the electro-optical elements being provided in the wiring region; and a plurality of first effective optical regions in which first electro-optical elements are provided; and a plurality of second effective optical regions in which second electro-optical elements are provided, wherein the ineffective optical regions are arranged on the lattice so as to be sandwiched between the first effective optical regions in the column direction and sandwiched between the second effective optical regions in the row direction.

2. An electronic apparatus, comprising:
the electro-optical device according to claim 1.

3. An electro-optical device comprising:
a substrate;
a plurality of first effective optical regions provided above the substrate, first electro-optical elements being provided in the first effective optical regions;
a plurality of second effective optical regions provided above the substrate, second electro-optical elements being provided in the second effective optical regions; and
a plurality of ineffective optical regions provided above the substrate, no electro-optical elements being provided in the ineffective optical regions,
each of the whole ineffective optical regions being arranged so as to be sandwiched by two of the first effective optical regions and so as to be sandwiched by two of the second effective optical regions.

4. The electro-optical device according to claim 3, wherein the first effective optical regions are not adjacent to each other.

5. The electro-optical device according to claim 3, the first effective optical regions and the second effective optical regions having the same shape.

6. The electro-optical device according to claim 3, the ineffective optical regions having anti-reflection members.

7. The electro-optical device according to claim 3, the first and second effective optical regions having respective electronic circuits to drive the electro-optical elements provided in the first and second effective optical regions.

8. The electro-optical device according to claim 7, at least one of the effective optical regions being in contact with an ineffective optical region in which no electronic circuit is provided below an electrode provided in the effective optical region or the electrode is not provided above the electronic circuit.

9. An electro-optical device according to claim 7, further comprising:
pixels provided so as to correspond to respective intersections of a plurality of scan lines and a plurality of data lines, the electronic circuits driving the electro-optical elements in accordance with scan signals from the scan lines and data signals from the data lines.

10. The electro-optical device according to claim 9, the electronic circuits comprising:
first transistors to supply data signals during electrical conduction;
capacitance elements to store, as an amount of charge, the data signals supplied from the first transistors; and
second transistors to supply an amount of current corresponding to the electrical-conduction state to the electro-optical elements, the electrical-conduction state being controlled in accordance with the amount of charge stored by the capacitance elements.

11. The electro-optical device according to claim 3, at least one of the first optical regions and at least one of the second optical regions having respective electronic circuits to drive the electro-optical elements provided in another first effective optical region and another effective optical region.

12. The electro-optical device according to claim 3, the ineffective optical regions having electronic circuits to drive the electro-optical elements provided in at least one of the first effective optical regions and at least one of the second effective optical regions.

13. The electro-optical device according to claim 3, the first electro-optical element and the second electro-optical element including two electro-optical elements selected from an electro-optical element that emits green, an electro-optical element that emits blue, and an electro-optical element that emits red.

14. The electro-optical device according to claim 3, each of the first electro-optical elements and the second electro-optical elements being an electroluminescent element.

15. The electro-optical device according to claim 14, the electroluminescent element having a light-emitting layer that includes organic material.

16. The electro-optical device according to claim 3, wherein the second effective optical regions are not arranged so as to be adjacent to each other.

17. The electro-optical device according to claim 3, each of the first effective optical regions in which the first electro-optical elements are provided being arranged at regular intervals in a column and row directions of a display area.

18. An electro-optical device, comprising:
a substrate;
a plurality of first light-emitting regions provided above the substrate, first light-emitting films being provided in the first light-emitting regions;
a plurality of second light-emitting regions provided above the substrate, second light-emitting films being provided in the second light emitting regions; and
a plurality of non-luminous regions provided above the substrate, no light-emitting films being provided in the non-luminous regions,
each of the whole non-luminous regions is arranged so as to be sandwiched by two of the first light-emitting regions and so as to be sandwiched by two of the second light-emitting regions.

19. The electro-optical device according to claim 18, wherein the first light-emitting films are not adjacent to each other.

20. The electro-optical device according to claim 18, the first light-emitting regions and the second light-emitting regions having the same shape.

21. The electro-optical device according to claim 18, the non-luminous regions having anti-reflection members.

22. The electro-optical device according to claim 18, the first and second light-emitting regions having respective electronic circuits to control light emission of the corresponding first and second light-emitting films.

23. The electro-optical device according to claim 18, at least one of the first and second light-emitting regions having an electronic circuit to control light emission of the first or second light-emitting film provided in another first or second light-emitting region.

24. The electro-optical device according to claim 18, the non-luminous region has an electronic circuit to control light emission of the first or second light-emitting film provided in at least one of the first and second light-emitting regions.

25. The electro-optical device according to claim 18, further comprising:
pixels provided so as to correspond to respective intersections of a plurality of scan lines and a plurality of data lines, the electronic circuits for the corresponding pixels controlling light emission of the first or second light-emitting films in accordance with scan signals from the scan lines and data signals from the data lines.

26. The electro-optical device according to claim 18, the first light-emitting film and the second light-emitting film include two light-emitting films selected from a light-emitting film that emits green, a light-emitting film that emits blue, and a light-emitting film that emits red.

27. The electro-optical device according to claim 18, each of the first and second light-emitting films includes organic material.

28. The electro-optical device according to claim 18, wherein the second light-emitting films are arranged so as to not be adjacent to each other.

29. The electro-optical device according to claim 18, each of the first light-emitting regions in which the first light-emitting films are provided being arranged at regular intervals in a column and row directions of a display area.

30. An active matrix substrate comprising:
a substrate;
a plurality of element forming regions and non-element forming regions provided in a square lattice above the substrate, the element forming regions having electrodes to connect with electronic elements, the electronic elements not being provided in the non-element forming regions, and the lattice having a column direction and a row direction; and
a wiring region provided above the substrate, wires to supply various electrical signals to the electronic elements via the electrodes being provided in the wiring region,
wherein the ineffective optical regions are arranged on the lattice so each ineffective region is sandwiched between a pair of first effective optical regions in the column direction and sandwiched between a pair of second effective optical regions in the row direction.

31. The active matrix substrate according to claim 30, the non-element forming regions having anti-reflection members.

32. An electronic apparatus, comprising:
the active matrix substrate according to claim 26.

33. An active matrix substrate comprising:
a substrate;
a plurality of first element forming regions provided above the substrate, first electro-optical elements being provided in the first element forming regions;
a plurality of second element forming regions provided above the substrate, second electro-optical elements being provided in the second element forming regions; and
a plurality of non-element-forming regions provided above the substrate, no electro-optical elements being provided in the non-element-forming regions,
each of the whole non-element-forming regions being arranged so as to be sandwiched by two of the first element forming regions and so as to be sandwiched by two of the second element forming regions.

34. The active matrix substrate according to claim 33, each of the first and second element forming regions has an electronic circuit to drive the first or second electro-optical element that is provided therein.

35. The active matrix substrate according to claim 33, at least one of the first and second element forming regions has an electronic circuit to drive the electro-optical element that is provided in another first or second element forming region.

36. The active matrix substrate according to claim 33, the non-element-forming region having an electronic circuit to drive the electro-optical element that is provided in at least one of the first and second element forming regions.

37. The active matrix substrate according to claim 33, each of the first element forming regions in which the first electro-optical elements are provided being arranged at regular intervals in a column and row directions of a display area.

* * * * *